(12) United States Patent
Kuroda

(10) Patent No.: US 8,144,041 B2
(45) Date of Patent: Mar. 27, 2012

(54) ELECTRONIC DEVICE

(75) Inventor: Keisuke Kuroda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/001,960

(22) PCT Filed: Sep. 2, 2010

(86) PCT No.: PCT/JP2010/005401
§ 371 (c)(1),
(2), (4) Date: Dec. 29, 2010

(87) PCT Pub. No.: WO2011/052128
PCT Pub. Date: May 5, 2011

(65) Prior Publication Data
US 2011/0205092 A1    Aug. 25, 2011

(30) Foreign Application Priority Data

Nov. 2, 2009  (JP) ................................ 2009-251695
Feb. 25, 2010  (JP) ................................ 2010-039724

(51) Int. Cl.
*H03M 1/10* (2006.01)
(52) U.S. Cl. ........ 341/120; 341/117; 341/118; 341/119; 341/155
(58) Field of Classification Search .......... 341/117–120, 341/155, 156; 398/208; 369/59.22
See application file for complete search history.

(56) References Cited

U.S. PATENT DOCUMENTS 5,719,843 A * 2/1998 Nakajima et al. .......... 369/59.22
2009/0245815 A1 * 10/2009 Zhang et al. .................. 398/208

FOREIGN PATENT DOCUMENTS

JP    05-107292 A    4/1993
JP    2006-345237 A    12/2006
JP    2008-157719 A    7/2008

OTHER PUBLICATIONS

International Search Report for JP2010-005401.

* cited by examiner

*Primary Examiner* — Jean B Jeanglaude
(74) *Attorney, Agent, or Firm* — Pearne & Gordon LLP

(57) ABSTRACT

An electronic device includes a frequency variable circuit, a filter, and an output voltage decision circuit. The frequency variable circuit changes the sampling frequency of an analog-digital converter. The filter limits a pass band of an output signal of the analog-digital converter. The output voltage decision circuit determines the noise level of the output signal of the analog-digital converter after the output signal passes through the filter. The electronic device performs a self-diagnosis as follows. The frequency variable circuit changes the sampling frequency of the analog-digital converter to a frequency outside of the pass band of the filter so as to change the quantization noise level of the analog-digital converter. Then, the output voltage decision circuit determines whether the integral of the quantization noise level is within a predetermined range.

4 Claims, 6 Drawing Sheets

ELECTRONIC DEVICE

This application is a U.S. National Stage Application of the PCT International Application No. PCT/JP2010/005401.

TECHNICAL FIELD

The present invention relates to electronic devices, such as automobiles, aircrafts, ships, robots, digital cameras, car navigation systems, and sensors.

BACKGROUND ART

FIG. 6 is an electrical diagram of a conventional electronic device. The electronic device includes detection device 1, pick up circuit 2, analog-digital (AD) converter 3, frequency supply circuit 4, output voltage decision circuit 7, and diagnosis signal supply circuit 8. Pick up circuit 2 detects, as a signal, physical information detected by detection device 1. Analog-digital converter 3 AD converts the signal detected by pick up circuit 2. Frequency supply circuit 4 determines the sampling frequency of analog-digital converter 3. Output voltage decision circuit 7 determines the magnitude of the output voltage of the output signal of analog-digital converter 3. Diagnosis signal supply circuit 8 supplies an analog signal for failure diagnosis to analog-digital converter 3. The self-diagnosis of the electronic device is completed when output voltage decision circuit 7 determines whether the output signal of analog-digital converter 3 which has received the analog signal is within a predetermined range. An example of a conventional technique related to the present invention is shown in Patent Literature 1.

CITATION LIST

Patent Literature

Patent Literature 1: Japanese Patent Unexamined Publication No. 2008-157719

SUMMARY OF THE INVENTION

In such a conventional electronic device, it is difficult to reduce the circuit size.

More specifically, in order to perform self-diagnosis, the conventional electronic device needs to have diagnosis signal supply circuit 8 for supplying an analog signal for failure diagnosis. This makes it difficult to reduce the circuit size of the electronic device.

The present invention is directed to provide an electronic device which has a compact circuit with a self-diagnosis function. The electronic device of the present invention includes a frequency variable circuit, a filter, and an output voltage decision circuit. The frequency variable circuit changes the sampling frequency of an analog-digital converter. The filter limits the pass band of the output signal of the analog-digital converter. The output voltage decision circuit calculates the integral of the noise level of the output signal of the analog-digital converter after the output signal passes through the filter. The electronic device performs self-diagnosis as follows. The frequency variable circuit changes the sampling frequency of the analog-digital converter to a frequency outside of the pass band of the filter so as to change the quantization noise level of the analog-digital converter. Then, the output voltage decision circuit determines whether the integral of the quantization noise level is within a predetermined range.

With this structure, the electronic device has a circuit with a self-diagnosis function without providing a diagnosis signal supply circuit for supplying an analog signal for failure diagnosis. As a result, the circuit of the electronic device can be compact.

DETAILED DESCRIPTION OF PREFERRED EMBODIMENT

First Exemplary Embodiment

An electronic device according to a first exemplary embodiment of the present invention will be described as follows with reference to drawings.

Figure 1:
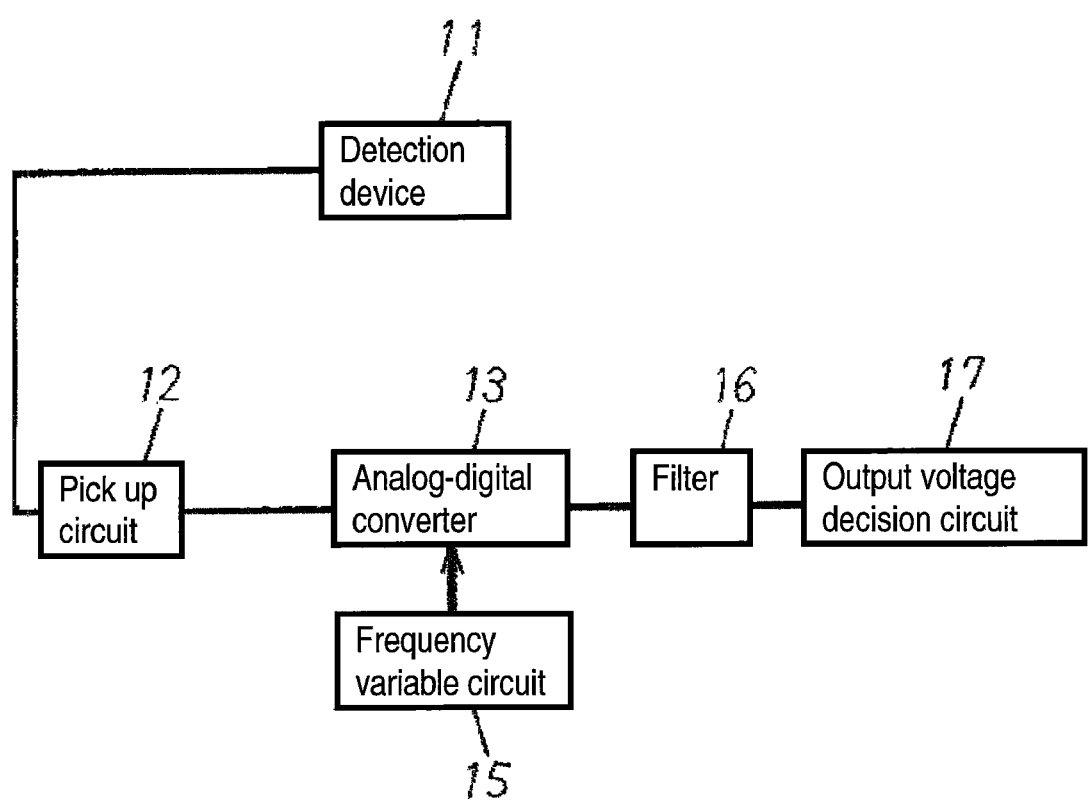
FIG. 1 is an electrical diagram of an electronic device according to a first exemplary embodiment of the present invention.

FIG. 1 is an electrical diagram of the electronic device according to the first exemplary embodiment of the present invention. The electronic device includes detection device 11, pick up circuit 12, analog-digital converter 13, frequency variable circuit 15, filter 16, and output voltage decision circuit 17.

Pick up circuit 12 detects, as a signal, physical information detected by detection device 11. Analog-digital (AD) converter 13 AD converts the signal detected by pick up circuit 12. Frequency variable circuit 15 changes the sampling frequency of analog-digital converter 13. Filter 16 limits the pass band of the output signal of analog-digital converter 13. Output voltage decision circuit 17 calculates the integral of the noise level of the output signal of analog-digital converter 13 after the output signal passes through filter 16.

The electronic device performs self-diagnosis as follows. Frequency variable circuit 15 changes the sampling frequency of analog-digital converter 13 to a frequency outside of the pass band of filter 16 so as to change the quantization noise level of analog-digital converter 13. Then, output voltage decision circuit 17 determines whether the integral of the quantization noise level is within a predetermined range or not.

With this structure, the electronic device has a circuit with a self-diagnosis function without providing a diagnosis signal supply circuit for supplying an analog signal for failure diagnosis. As a result, the circuit of the electronic device can be compact.

The following is a more detailed description of the present exemplary embodiment.

Figure 2:
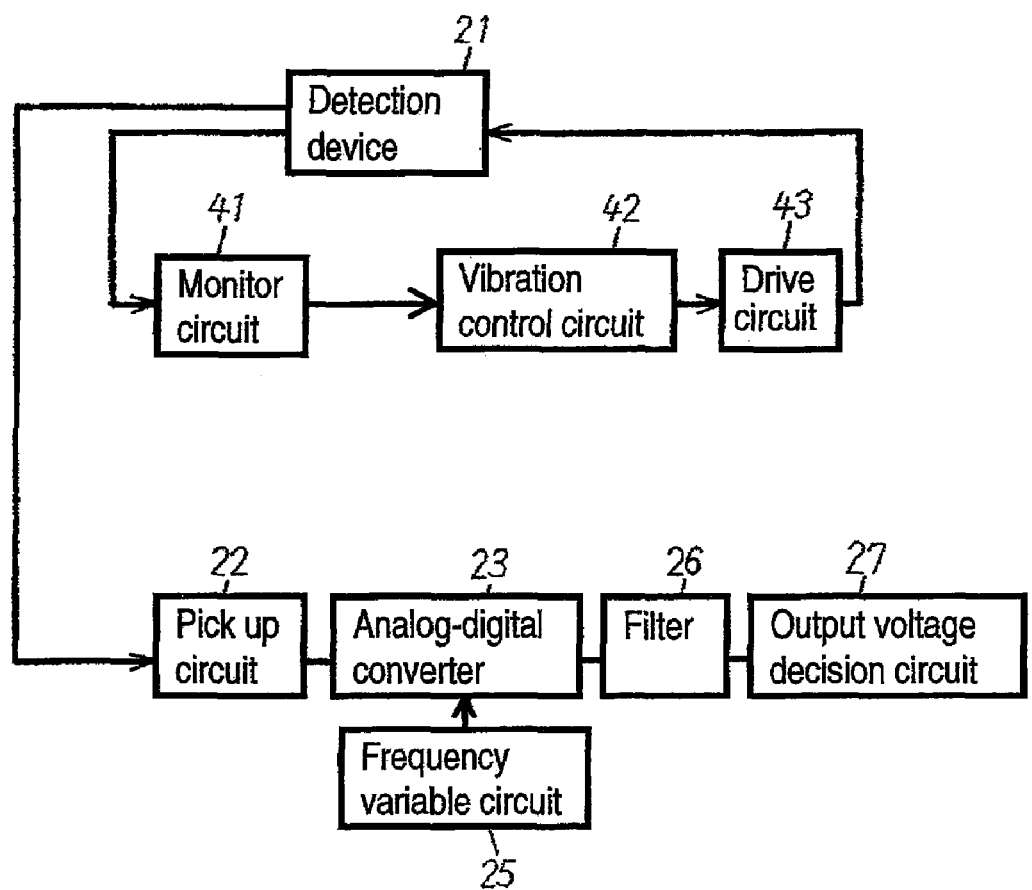
FIG. 2 is an electrical diagram of another example of the electronic device according to the first exemplary embodiment of the present invention.

FIG. 2 is an electrical diagram of an angular velocity sensor as another example of the electronic device. The angular velocity sensor at least includes detection device 21, monitor circuit 41, vibration control circuit 42, and drive circuit 43. Detection device 21 is vibrated by a drive signal outputted from drive circuit 43. Monitor circuit 41 detects and amplifies a monitor signal according to the vibration amplitude from detection device 21. Vibration control circuit 42 receives the monitor signal amplified by monitor circuit 41, and keeps the amplitude of the monitor signal constant, thereby keeping the drive amplitude of detection device 21 constant. Drive circuit 43 receives the constant-amplitude monitor signal from vibration control circuit 42 and outputs the drive signal.

Detection device 21 detects an angular velocity, which is then detected as a signal by pick up circuit 22. Pick up circuit 22 outputs an output signal to analog-digital converter 23 where the signal is converted into a digital signal. Analog-digital converter 23 outputs an output signal to filter 26 which outputs an output signal to output voltage decision circuit 27.

Figure 3:
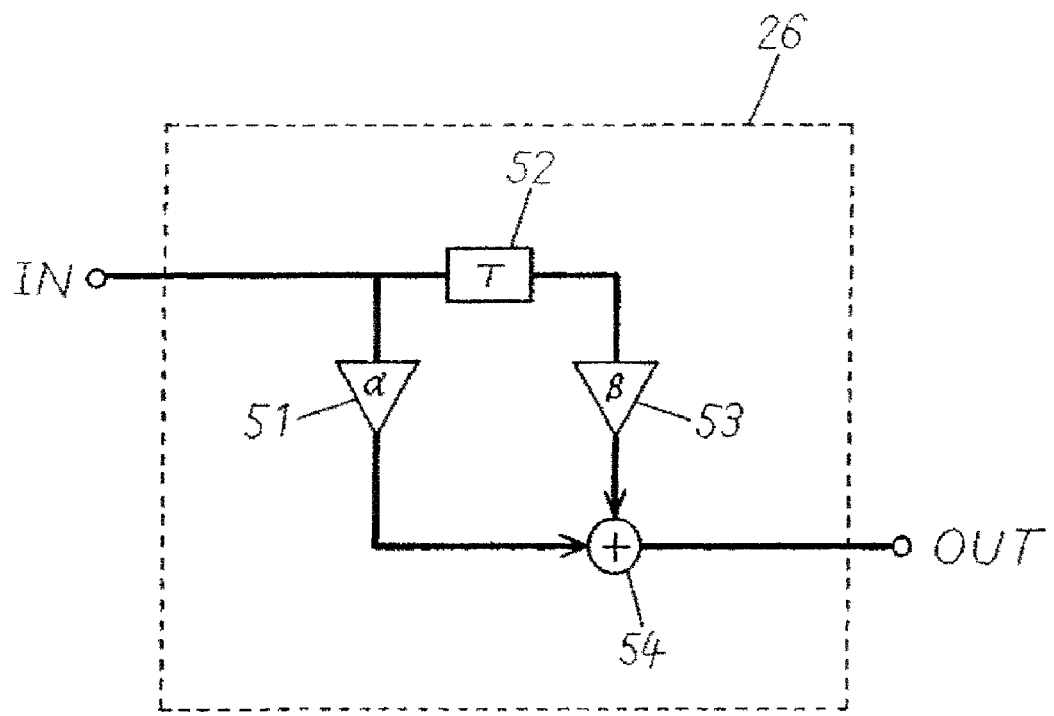
FIG. 3 is an electrical diagram of a filter in the electronic device according to the first exemplary embodiment of the present invention.

FIG. 3 is an electrical diagram of filter 26 in the electronic device according to the present exemplary embodiment. First, the output signal of analog-digital converter 23 is supplied to first amplifier 51 having gain a, and delay device 52 having a delay time T. Next, delay device 52 outputs an output signal to second amplifier 53 having gain β. The outputs of first and second amplifiers 51 and 53 are added by adder circuit 54 and then outputted therefrom. Filter 26 in the present exemplary embodiment is a low-pass filter.

Filter 26 can alternatively be a band-pass filter or a high-pass filter instead of the low-pass filter. It is preferable, however, to use the low-pass filter in order to accurately detect a change, mentioned below, in the integral of an after-mentioned quantization noise level in output voltage decision circuit 27.

The AD conversion in analog-digital converter 23 is performed based on a sampling frequency fs which is supplied from frequency variable circuit 25. At this moment, a quantization error occurs according to the value of the sampling frequency fs for the AD conversion, thereby generating quantization noise.

Figure 4:
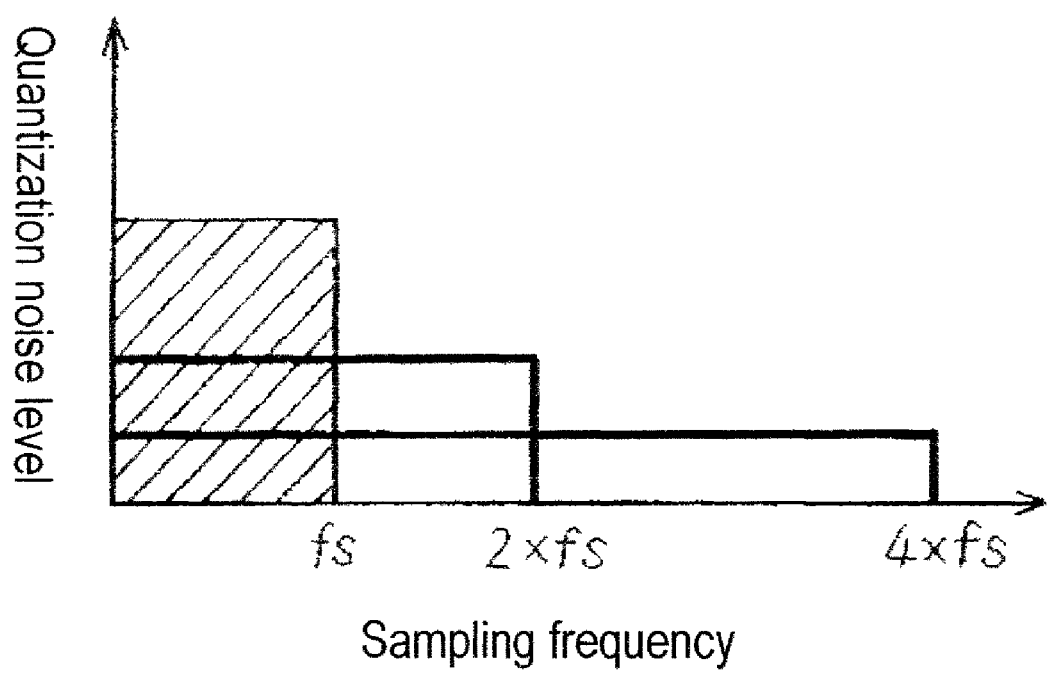
FIG. 4 shows the relation between sampling frequency and quantization noise of an analog-digital converter in the electronic device according to the first exemplary embodiment of the present invention.

FIG. 4 shows the relation between the sampling frequency and the quantization noise of the analog-digital converter in the electronic device according to the present exemplary embodiment. The frequency spectrum of the quantization noise changes with the value of the sampling frequency fs. For example, when the sampling frequency is doubled, the quantization noise has twice the frequency range, and the quantization noise level is reduced by half.

Figure 5:
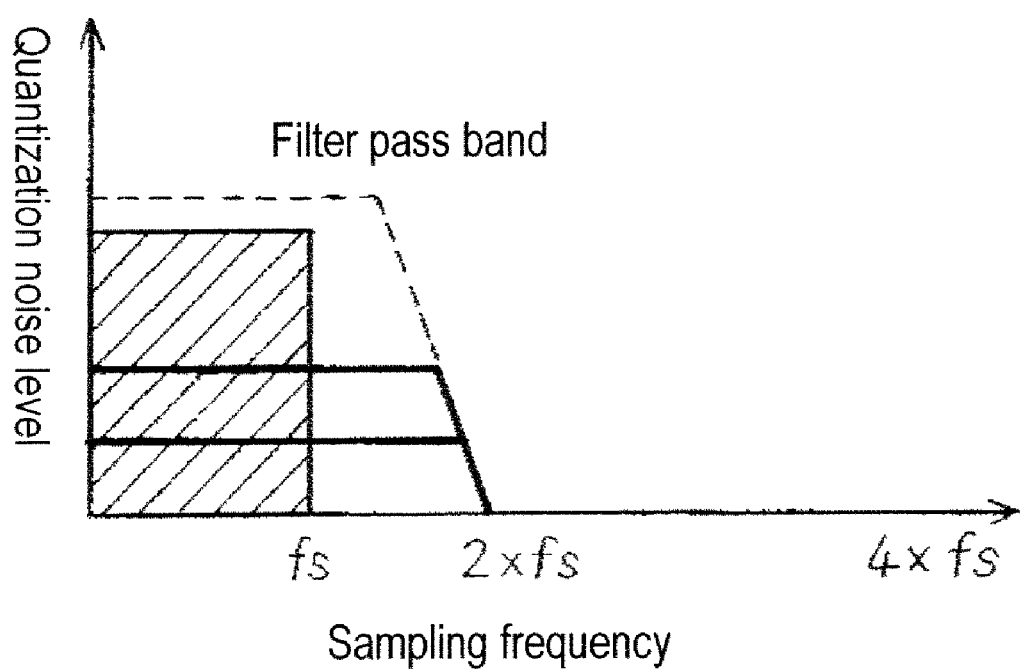
FIG. 5 shows the relation between a sampling frequency and a quantization noise after the output signal of the analog-digital converter passes through the filter in the electronic device according to the first exemplary embodiment of the present invention.
Figure 6:
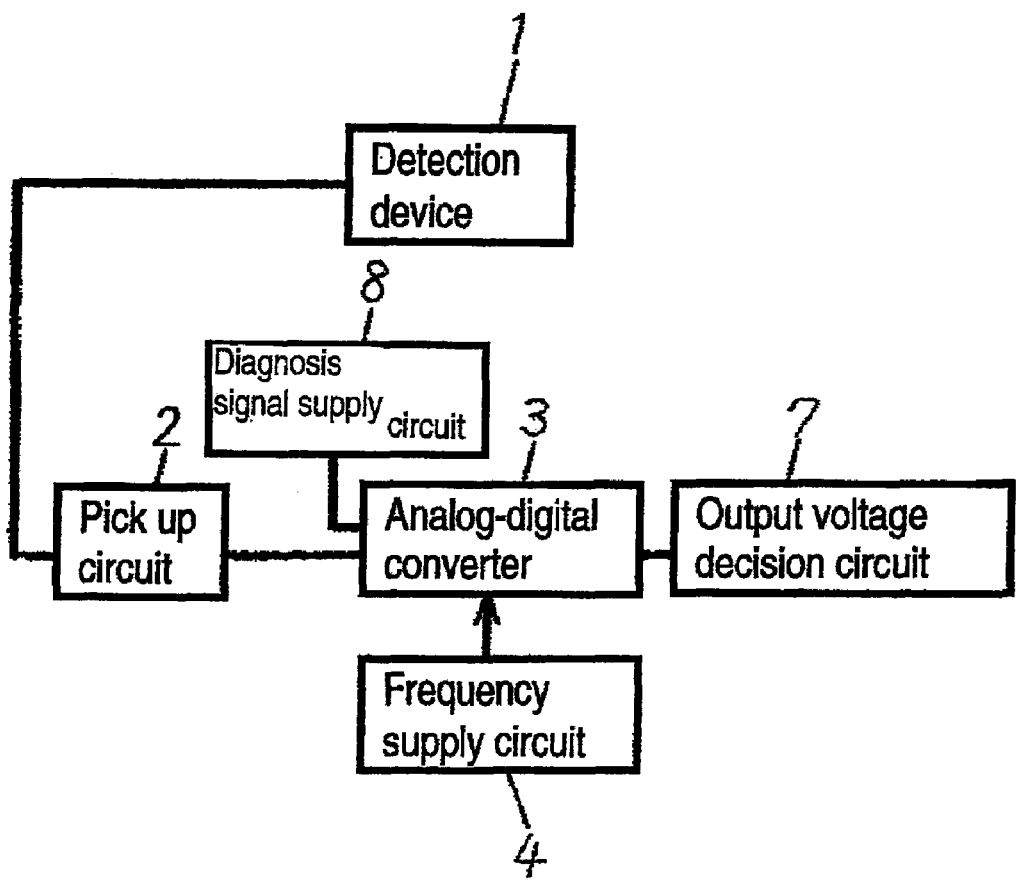
FIG. 6 is an electrical diagram of a conventional electronic device.

FIG. 5 shows the relation between sampling frequency and quantization noise after the output signal of the analog-digital converter passes through the filter in the electronic device according to the present exemplary embodiment. Frequency variable circuit 25 shown in FIG. 2 changes the sampling frequency fs of analog-digital converter 23 to a frequency outside of the pass band of filter 26. This results in a decrease in the integral of the quantization noise level of the output signal of filter 26 in the pass band as shown in FIG. 5. In other words, the integral of the quantization noise level to be supplied to output voltage decision circuit 27 can be changed by changing the sampling frequency fs by frequency variable circuit 25.

In the case of a failure, such as disconnection or the fixation of an output value, in a signal path located after analog-digital converter 23, the integral of the quantization noise level to be supplied to output voltage decision circuit 27 does not change even when the sampling frequency fs is changed. This allows the failure to be determined by calculating the integral of the quantization noise level by output voltage decision circuit 27.

With this structure, the electronic device has a circuit with a self-diagnosis function without providing a diagnosis signal supply circuit for supplying an analog signal for failure diagnosis. As a result, the circuit of the electronic device can be compact.

The present exemplary embodiment explains the angular velocity sensor as an example, but the effect of the present invention can also be obtained in other electronic devices, such as acceleration sensors, as long as they are provided with analog-digital converter 23 having a variable sampling frequency.

INDUSTRIAL APPLICABILITY

An electronic device of the present invention having a compact circuit is useful to various electronic devices, such as automobiles, aircrafts, ships, robots, digital cameras, car navigation systems, and sensors.

REFERENCE MARKS IN THE DRAWINGS 1 detection device
2 pick up circuit
3 analog-digital converter
4 frequency supply circuit
7 output voltage decision circuit
11 detection device
12 pick up circuit
13 analog-digital converter
15 frequency variable circuit
16 filter
17 output voltage decision circuit
21 detection device
22 pick up circuit
23 analog-digital converter
25 frequency variable circuit
26 filter
27 output voltage decision circuit
41 monitor circuit
42 vibration control circuit
43 drive circuit
51 first amplifier
52 delay device
53 second amplifier
54 adder circuit

The invention claimed is:

1. An electronic device comprising:
a detection device;
a pick up circuit for detecting, as a signal, physical information detected by the detection device;
an analog-digital (AD) converter for AD converting the signal detected by the pick up circuit;
a frequency variable circuit for changing a sampling frequency of the analog-digital converter;
a filter for limiting a pass band of an output signal of the analog-digital converter; and
an output voltage decision circuit for calculating an integral of a noise level of the output signal of the analog-digital converter after the output signal passes through the filter, wherein
the electronic device performs self-diagnosis by making the frequency variable circuit change the sampling frequency of the analog-digital converter to a frequency outside of the pass band of the filter so as to change a quantization noise level of the analog-digital converter, and then by making the output voltage decision circuit determine whether the integral of the quantization noise level is within a predetermined range or not.

2. The electronic device of claim 1, wherein the physical information detected by the detection device is an angular velocity applied to the detection device.

3. The electronic device of claim 1, wherein the filter is a low-pass filter.

4. The electronic device of claim 3, wherein the filter comprises:

a first amplifier for receiving the output signal of the analog-digital converter;

a delay device for receiving the output signal of the analog-digital converter;

a second amplifier for receiving an output signal of the delay device, and an adder circuit for adding output signals of the first and second amplifiers and outputting an addition result.

* * * * *